(12) United States Patent
Rodgers et al.

(10) Patent No.: US 11,589,487 B2
(45) Date of Patent: Feb. 21, 2023

(54) ON-DEMAND METHOD OF MAKING PCB PALLETS USING ADDITIVE MANUFACTURING

(71) Applicant: Jabil Inc., St. Petersburg, FL (US)

(72) Inventors: Luke Rodgers, St. Petersburg, FL (US); Erik Gjovik, St. Petersburg, FL (US)

(73) Assignee: JABIL INC., St. Petersburg, FL (US)

( * ) Notice: Subject to any disclaimer, the term of this patent is extended or adjusted under 35 U.S.C. 154(b) by 316 days.

(21) Appl. No.: 16/480,594

(22) PCT Filed: Jan. 24, 2018

(86) PCT No.: PCT/US2018/015008
§ 371 (c)(1),
(2) Date: Jul. 24, 2019

(87) PCT Pub. No.: WO2018/140469
PCT Pub. Date: Aug. 2, 2018

(65) Prior Publication Data
US 2019/0394914 A1 Dec. 26, 2019

Related U.S. Application Data

(60) Provisional application No. 62/449,973, filed on Jan. 24, 2017.

(51) Int. Cl.
*B29C 64/10* (2017.01)
*H05K 13/00* (2006.01)
(Continued)

(52) U.S. Cl.
CPC ......... *H05K 13/0069* (2013.01); *B29C 64/10* (2017.08); *B29C 64/118* (2017.08);
(Continued)

(58) Field of Classification Search
CPC .................................................. B29C 64/165
See application file for complete search history.

(56) References Cited

U.S. PATENT DOCUMENTS 6,142,357 A * 11/2000 Howell ................. B23K 3/087
118/406
2004/0172817 A1* 9/2004 Gleason ............ H05K 13/0069
29/840
(Continued)

FOREIGN PATENT DOCUMENTS

JP 11186705 A 7/1999
JP 2001339148 A 12/2001
(Continued)

OTHER PUBLICATIONS

International Search Report and Written Opinion dated Aug. 2, 2018 in PCT/US2018/015008.
(Continued)

*Primary Examiner* — Cachet I Proctor
(74) *Attorney, Agent, or Firm* — Thomas J. McWilliams; Barnes & Thornburg LLP

(57) ABSTRACT

A method of making a printed circuit board pallet is provided. The method of making the pallet illustratively includes the steps of: providing a base in a form of a polymer sheet stock; applying a fluid onto the base at selective locations where the pallet will be built-up to a three-dimensional form; depositing a polymer powder onto the base at the selective locations applied with the fluid; removing any excess amounts of the polymer powder not adhered to the fluid; and heating the pallet to fuse the polymer powder together and to the base.

8 Claims, 3 Drawing Sheets

(51) Int. Cl.
  *B29C 64/118* (2017.01)
  *B33Y 99/00* (2015.01)
  *H05K 3/34* (2006.01)
  *H05K 3/00* (2006.01)

(52) U.S. Cl.
  CPC ............ *B33Y 99/00* (2014.12); *H05K 3/0073* (2013.01); *H05K 3/3452* (2013.01); *H05K 3/3468* (2013.01); *H05K 2203/0156* (2013.01); *H05K 2203/0173* (2013.01); *H05K 2203/044* (2013.01); *H05K 2203/0557* (2013.01); *H05K 2203/1476* (2013.01)

(56) References Cited

U.S. PATENT DOCUMENTS

| 2009/0004381 | A1* | 1/2009 | Fujisawa | B29C 64/165 425/375 |
| 2013/0220570 | A1* | 8/2013 | Sears | B22C 9/10 164/34 |
| 2015/0231825 | A1* | 8/2015 | Swartz | B29C 64/141 428/156 |
| 2017/0247553 | A1* | 8/2017 | Ganapathiappan | C09D 11/50 |
| 2018/0126475 | A1* | 5/2018 | Mehkri | B29C 64/112 |
| 2018/0320009 | A1* | 11/2018 | Ganapathiappan | B33Y 70/00 |

FOREIGN PATENT DOCUMENTS

| JP | 2002079536 A | 3/2002 |
| JP | 2003142817 A | 5/2003 |

OTHER PUBLICATIONS

International Preliminary Report on Patentability, dated Jul. 30, 2019 for PCT/US2018/015008.

* cited by examiner

ON-DEMAND METHOD OF MAKING PCB PALLETS USING ADDITIVE MANUFACTURING

CROSS-REFERENCE TO RELATED APPLICATIONS

This application is a national stage application of International Patent Application PCT/US2018/015008, filed Jan. 24, 2018, entitled "On-Demand Method of Making PCB Pallets Using Additive Manufacturing" which claims priority to United States provisional application Ser. No. 62/449,973, filed Jan. 24, 2017, entitled "On-Demand Method of Making PCB Pallets Using Additive Manufacturing," which is hereby incorporated by reference.

BACKGROUND

Field of the Disclosure

The present disclosure relates to printed circuit board pallets, and particularly, to materials and methods of making on-demand printed circuit board pallets used in manufacturing printed circuit boards.

Description of the Background

Pallets such as selective wave soldering pallets are used to build printed circuit boards (PCBs). These PCB pallets provide a template to help install through hole components on the PCB during assembly. Additionally, PCB pallets protect surface mount components and provide unmasked areas for wave soldering. These PCB pallets are typically made by a hand lay-up process that starts with a glass fiber-embedded thermo-setting sheet. The sheets are stacked one on top of the other, to form a tray. The tray is then put under pressure and elevated temperatures to cure the thermosetting polymer. Often, the tray for the pallet may need to be cut using a computer numeric control (CNC) cutting system to make all the holes and slots needed for the particular PCB layout.

Serving as the template for the circuit design, PCB pallets are subjected to cyclic heat from soldering, and impact and chemicals from component installation. Because of this relatively harsh environment, PCB pallets tend to wear down relatively quickly and need replacing.

More specifically, when in use, the pallet and PCB are placed in a bath of solder which adheres to the PCB through the holes and slots in the pallet. A variety of cleaning agents and other chemicals are then applied to the PCB while on the pallet. It is, therefore, easy to see how these pallets wear down over time and need to be replaced. Replacement is an issue, however, since these pallets are expensive and take a relatively long time to make. Being hand-built and require substantial CNC time to create the final design of the pallet results in a multi-week turnaround time. Such PCB pallets are highly specialized to each particular PCB, so waiting for pallets made according to current methods might stop or delay a surface mount technology PCB manufacturing line.

SUMMARY

The present disclosure includes building a PCB pallet through an on-demand additive manufacturing process rather than using conventional hand lay-up, or other processes. Illustratively, the on-demand method of making a new PCB pallet may include providing an inorganic sheet stock for the base. Using a printing-type process, a controlled spray of fluid is applied onto the base at selective locations where the pallet will be built-up. After the fluid application, a polymer powder is deposited onto the sheet stock at the locations sprayed with the fluid. The excess powder is removed and the process repeated as necessary to form stacks that creates the PCB template on the pallet. The pallet is then put under pressure and heated to fuse the polymer powder to form the completed final PCB pallet.

An illustrative embodiment of the present disclosure provides a method of making a PCB pallet. The method of making the pallet comprises the steps of: providing a base in the form of an inorganic sheet stock; applying a fluid onto the base at selective locations where the pallet will be built-up to a three-dimensional form; depositing a polymer powder on to the base at the selective locations applied with the fluid; removing any excess amounts of the polymer powder not adhered to the fluid; and heating the pallet to fuse the polymer powder together.

In the above and other illustrative embodiments, the method of making a printed circuit board pallet may further comprise: the inorganic sheet stock including randomly oriented fibers made from a material selected from the group consisting of glass and carbon; the fluid being a coalescing agent; the fluid being printed onto the inorganic sheet stock at that selective locations based on a design of a printed circuit board; the fluid being a volatile fluid; the fluid being selected from the group consisting of at least one of water, water with 2-pyrrolydone, glycol, and oil; the step of applying the fluid is accomplished using a method selected from the group consisting of inkjet, spray nozzles, rollers, and stamps; the polymer powder that is deposited onto the base at the selective locations applied with the fluid being selected from the group consisting of at least one of a thermoplastic powder, thermoset powder, nylon, polyethylene, polyether ether ketone; the excess amounts of the polymer powder being removed by a mechanism selected from the group consisting of blown compressed air, vacuum, vibration, and agitation; the step of repeating the steps of providing another base in a form of an inorganic sheet stock; applying another fluid onto the base at selective locations on the another base to build-up the pallet in three-dimensions; depositing additional polymer powder on to the another base at the selective locations applied with the another fluid; and removing any excess amounts of the another polymer powder not adhered to the another fluid before heating the pallet; the pallet being heated in a thickening oven; and the oven temperature being about 250 degrees Fahrenheit and above.

Another illustrative embodiment of the present disclosure provides a method of making a printed circuit board pallet. The method of making the pallet comprises the steps of: extruding a thermoplastic sheet stock; and overprinting the thermoplastic sheet stock with a polymer material to form three-dimensional features on the pallet.

In the above and other illustrative embodiments, the method of making a printed circuit board pallet may further comprise: the thermoplastic sheet stock being overprinted using fused deposition molding, and cutting the thermoplastic sheet stock.

BRIEF DESCRIPTION OF THE DRAWINGS

The exemplary apparatuses, systems, and methods shall be described hereinafter with reference to the attached drawing which is given as a non-limiting example only, in which.

DETAILED DESCRIPTION

Figure 1:
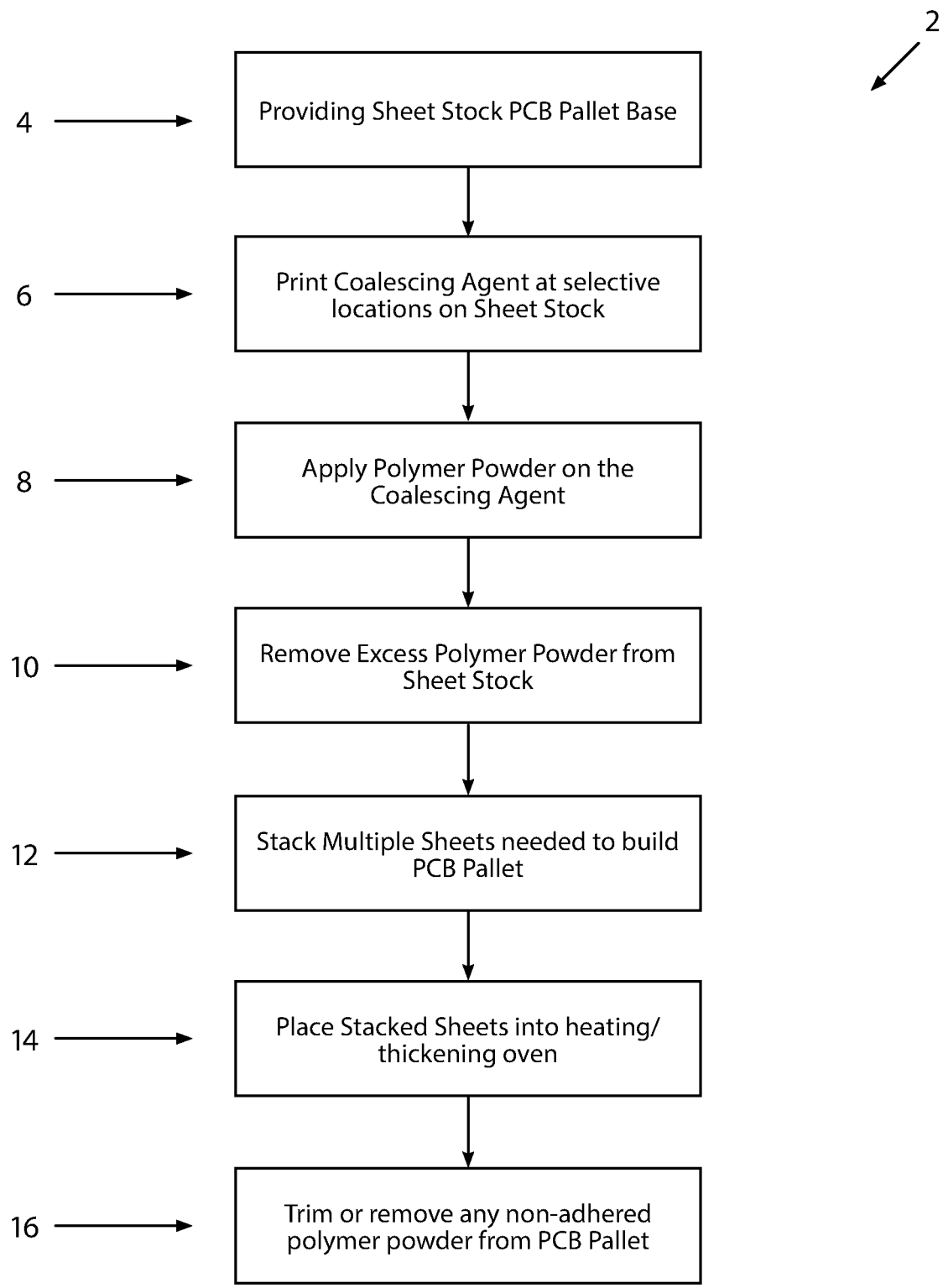
FIG. 1 is a simplified flow chart depicting an illustrative method of making a PCB pallet.

The figures and descriptions provided herein may have been simplified to illustrate aspects that are relevant for a clear understanding of the herein described apparatuses, systems, and methods, while eliminating, for the purpose of clarity, other aspects that may be found in typical similar devices, systems, and methods. Those of ordinary skill may thus recognize that other elements and/or operations may be desirable and/or necessary to implement the devices, systems, and methods described herein. But because such elements and operations are known in the art, and because they do not facilitate a better understanding of the present disclosure, for the sake of brevity a discussion of such elements and operations may not be provided herein. However, the present disclosure is deemed to nevertheless include all such elements, variations, and modifications to the described aspects that would be known to those of ordinary skill in the art.

Embodiments are provided throughout so that this disclosure is sufficiently thorough and fully conveys the scope of the disclosed embodiments to those who are skilled in the art. Numerous specific details are set forth, such as examples of specific components, devices, and methods, to provide a thorough understanding of embodiments of the present disclosure. Nevertheless, it will be apparent to those skilled in the art that certain specific disclosed details need not be employed, and that embodiments may be embodied in different forms. As such, the embodiments should not be construed to limit the scope of the disclosure. As referenced above, in some embodiments, well-known processes, well-known device structures, and well-known technologies may not be described in detail.

The terminology used herein is for the purpose of describing particular embodiments only and is not intended to be limiting. For example, as used herein, the singular forms "a," "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The steps, processes, and operations described herein are not to be construed as necessarily requiring their respective performance in the particular order discussed or illustrated, unless specifically identified as a preferred or required order of performance. It is also to be understood that additional or alternative steps may be employed, in place of or in conjunction with the disclosed aspects.

When an element or layer is referred to as being "on," "upon," "connected to" or "coupled to" another element or layer, it may be directly on, upon, connected or coupled to the other element or layer, or intervening elements or layers may be present, unless clearly indicated otherwise. In contrast, when an element or layer is referred to as being "directly on," "directly upon," "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). Further, as used herein the term "and/or" includes any and all combinations of one or more of the associated listed items.

Yet further, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the embodiments.

The present disclosure is directed to building a PCB pallet on-demand using additive manufacturing rather than using conventional hand lay-up, or other processes. The on-demand method of making a new PCB pallet may include providing a polymer sheet stock for the base. Using a printing-type process, a controlled spray of fluid is applied onto the base at selective locations where the pallet will be built-up. After the fluid application, a polymer powder is deposited to the sheet stock at the locations sprayed with the fluid. Any excess powder is removed and the process is repeated as necessary to form stacks. These stacks form the PCB template on the pallet. The pallet is then heated and cooled to fuse the polymer powder together forming a completed PCB pallet. In an illustrative embodiment the inorganic base may be either chemically or physically removed, via acid etching, sand blasting, or other like means.

More particularly, an illustrative embodiment of a process for on-demand building of a PCB pallet as indicated by reference numeral 2, is shown in FIG. 1. The process starts by providing sheet stock that serves as the PCB pallet base, as indicated by reference numeral 4. A coalescing agent is then printed onto the sheet stock at selective locations based on the ultimate design and configuration of the PCB, as indicated at reference numeral 6. After the coalescing agent, a powdered polymer is applied to the sheet stock on the coalescing agent, as indicated by reference numeral 8. Excess polymer powder may then be removed from the sheet stock, as indicated by reference numeral 10. It will be appreciated by the skilled artisan that the excess polymer resides at locations not printed with the coalescing agent at 6 to be removed. With the excess polymer removed, the process may be repeated wherein stacks of multiple sheets can be placed on top of each other, as indicated by reference numeral 12. This builds-up the three-dimensional shape on the pallet needed for the PCB template. Once this is done, the stacked sheets are placed into a thickening oven and heated, as indicated by reference number 14. This fuses the applied polymer powder. The pallet is then removed from the oven as indicated by reference numeral 16. Any additional loose polymer can then be removed, and the pallet trimmed as necessary to complete the on-demand build process.

As indicated, the starting point in this illustrative embodiment is providing the sheet stock base that will be used as the foundation to build-up the PCB pallet design. Illustratively, the sheet stock may be either a glass or carbon fiber mat that can be cut to the desired size and shape as needed pallet.

With respect to applying the liquid pursuant to the step identified by reference number 6, a coalescing agent may be applied to the sheet stock. It is appreciated that that the fluid may be any coalescing fluid such as monomers or oligomers of the polymer powder to be applied to the sheet stock. Alternatively, the applied liquid may be a volatile fluid such as water, water with 2-pyrrolydone, glycols, oils, surfactants or combinations thereof. It is further appreciated, that applying the liquid may be done by a variety of printing or depositing mechanisms such as inkjet heads and nozzles, rollers, stamps, etc. The point is the fluid is deposited according to a predefined design based on the structural characteristics needed for the final PCB pallet.

With regard to the polymer powder application step identified by reference numeral 8 in FIG. 1, the powder polymer is applied on the sheet stock at the locations defined by the fluid application. The powder, therefore, adheres to the liquid on the sheet stock. It is appreciated that suitable polymer powders may include thermoplastic or thermoset powders, nylon, polyethylene, polyether ether ketone (PEEK), polyaryl ether ketones to include Polyketone, polyether ketone, polyether ketone ketone, polyether ether ketone, polyphenylene sulfide, polyphenylen sulfone, polyether sulfone. Polyamideimide, polyimide or copolymers thereof and alloys thereof. It is further appreciated that with these and other like polymers, the particle size and distribution may be used to control the characteristics of the resulting raised layers formed on the sheet stock.

To create the desired shape that the polymer is intended to make, any excess powder polymer needs to be removed according to the step indicated by reference numeral 10 of FIG. 1. It is appreciated that the powder may be removed by any variety of means such as blown compressed air, vacuum, vibration, agitation, etc. The objective being that all the loose powder is removed from locations on the sheet stock not specifically deposited with the fluid.

After the polymer is applied and the excess removed, this process may be repeated to the extent needed depending on the design of the PCB template. The point of adding the layers on the sheet stock is to create the three-dimensional body in the configuration needed to create a PCB. Accordingly, the above process is repeated with the polymer and sheets stacked on top of each other to the extent necessary to make the appropriate three-dimensional shape.

Once the stacks are built from the step at 12, they may be placed into an oven to fuse the powder to form the final structure. Here, the powder heats and fuses the particles to each other and to the sheet stock. In addition, the applied coalescing agent or other liquid evaporates during this heating step. It is also appreciated that the liquid may be removed through other means depending on the type of liquid used, the polymer applied, and the curing means. Furthermore, the temperature and duration in the oven will depend on the polymers used for the powder and sheet stock, as will be contemplated by the skilled artisan. An illustrative temperature may be above about 250 degrees Fahrenheit.

Once the pallet is solidified and removed from the oven, any remaining polymer powder or excess fused powder may be trimmed or removed by means known to the skilled artisan. Also, the inorganic sheet stock is removed. After this clean-up step, the pallet should be fully formed and ready for use in production—hence and on-demand PCB pallet.

Using this on-demand additive process, the time needed to make a replacement pallet can be shortened from 3-7 days to the same day. No longer is a time-consuming hand build-up process needed to create the PCB pallet. Also the CNC time is reduced and possibly, in some cases, eliminated. It may also be less expensive and provide direct control over the pallet build process. This translates into shorter lead times for making any PCBs which may reduce the risk of a surface mount technology PCB manufacturing line shutting down down to wait for new pallets.

Figure 2:
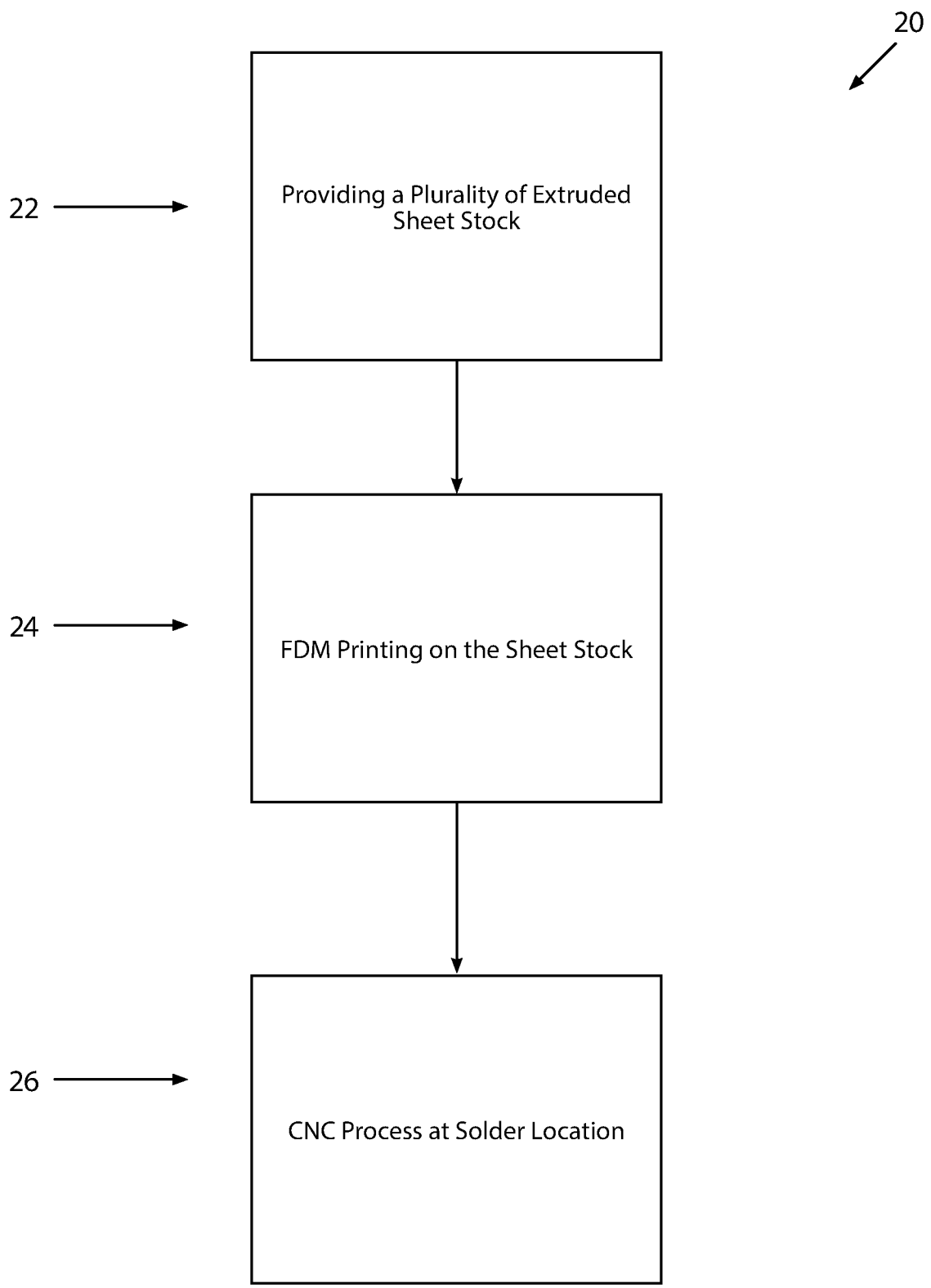
FIG. 2 is another simplified flow chart depicting an alternate illustrative method of making a PCB pallet.

Another illustrative embodiment may include extruding a thermoplastic sheet stock and then overprinting the necessary features using a fused deposition molding (FDM) style printer to make PCB pallets. A simplified flow chart depicting this alternate method of making a PCB pallet, as indicated by reference numeral 20, is shown in FIG. 2. Illustratively, a plurality of sheet stock is extruded at a nominal sheet thickness of about 100 mils, as indicated at reference numeral 22. The sheets are then run through a FDM printer to print the selective build locations, as indicated at reference numeral 24. The FDM printer essentially over-molds the damming features on the pallet. This keeps the solder material away from the non-soldered portions of the PCB. It is appreciated this process can be employed with the CNC printer to make all the cuts into the pallet base for the solder locations, as indicated at reference numeral 26.

Figure 3:
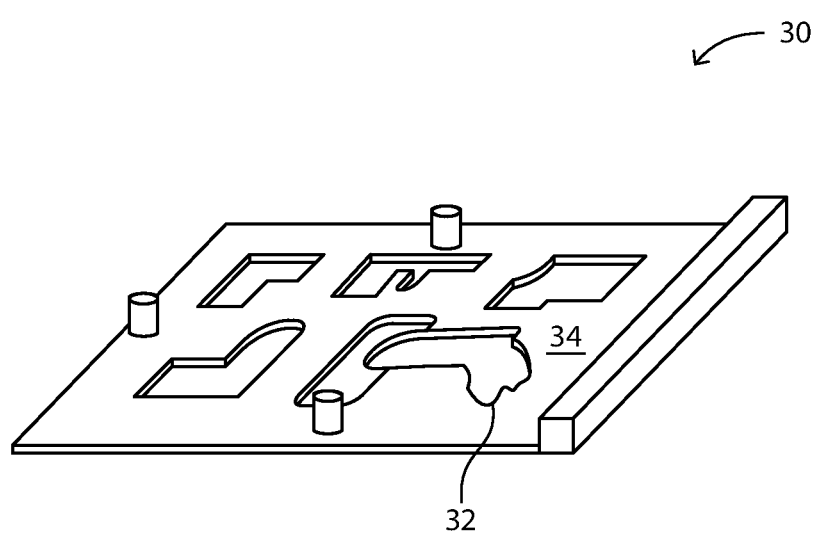
FIG. 3 is a perspective view of a PCB pallet that includes a damaged portion.

In a further illustrative embodiment, the methods disclosed in FIGS. 1 and 2 may be employed to repair a damaged PCB pallet. A perspective view of PCB pallet 30 shown in FIG. 3 includes a damaged portion 32. Employing the steps of method 2 may be used to repair it. This includes applying a coalescing agent (as indicated at reference numeral 6 from FIG. 2) on base 34 based at the damages area. The powdered polymer is then applied onto the coalescing agent (as originally indicated by reference numeral 8). Excess polymer powder may then be removed from the PCB pallet. These steps may be repeated until sufficient polymer has been added to base 34. Accordingly, the damaged portion can be built-up back to its original configuration. It is further appreciated that the alternative process 20 disclosed in FIG. 2 may be applied to PCB pallet 30 as well.

Further, the descriptions of the disclosure are provided to enable any person skilled in the art to make or use the disclosed embodiments. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but rather are to be accorded the widest scope consistent with the principles and novel features disclosed herein.

What is claimed is:

1. A method of making a printed circuit board pallet, the method comprising the steps of:
   providing a base in a form of an inorganic sheet stock;
   printing a coalescing agent fluid that is a monomer or oligomer of a polymer powder to be deposited onto the base only at selective damage locations comprising a particular repair pattern for the printed circuit board pallet where the pallet will be built-up to an original three-dimensional form at the selective damage locations;
   depositing the polymer powder on to the base at the selective damage locations printed with the coalescing agent fluid;
   removing any excess amounts of the polymer powder not adhered to the coalescing agent fluid; and heating the pallet to fuse the polymer powder together and to the base.

2. The method of claim 1, wherein the inorganic sheet stock includes randomly oriented fibers made from a material selected from the group consisting of glass and carbon.

3. The method of claim 1, wherein the step of applying the coalescing agent fluid is accomplished using an inkjet.

4. The method of claim 1, wherein the polymer powder that is deposited onto the base at the selective locations is selected from the group consisting of at least one of a thermoplastic powder, thermoset powder, nylon, polyethylene, polyaryl ether ketone, polyphenylene sulfide, polyether sulfone.

5. The method of claim 1, wherein the excess amounts of the polymer powder are removed by a mechanism selected from the group consisting of blown compressed air, vacuum, vibration, and agitation.

6. The method of claim 1, further comprising the step of repeating the steps of providing another base in a form of a polymer sheet stock; applying another fluid onto the base at selective locations on the another base to build-up the pallet in three-dimensions; depositing additional polymer powder on to the another base at the selective locations applied with the another fluid; and removing any excess amounts of the another polymer powder not adhered to the another fluid before heating the pallet.

7. The method of claim 1, wherein the pallet is heated in an oven.

8. The method of claim 7, wherein the oven temperature is about 250 degrees Fahrenheit and above.

* * * * *